United States Patent [19]

Pena et al.

[11] Patent Number: 4,583,676
[45] Date of Patent: Apr. 22, 1986

[54] METHOD OF WIRE BONDING A SEMICONDUCTOR DIE AND APPARATUS THEREFOR

[75] Inventors: Edward Pena, Austin, Tex.; S. L. Cheong, Kuala Lumpur, Malaysia

[73] Assignee: Motorola, Inc., Schaumburg, Ill.

[21] Appl. No.: 374,449

[22] Filed: May 3, 1982

[51] Int. Cl.$^3$ .................. B23K 31/02; H05K 3/34
[52] U.S. Cl. .................. 228/179; 228/4.5; 228/44.7; 228/232; 219/56.21
[58] Field of Search .............. 228/4.5, 5.1, 44.1 A, 228/230, 232, 179; 219/56.21, 85 D, 85 F

[56] References Cited

U.S. PATENT DOCUMENTS

| | | | |
|---|---|---|---|
| 3,224,072 | 12/1965 | Summers | 29/840 |
| 3,468,523 | 9/1969 | Dix | 228/44.1 A |
| 3,576,969 | 5/1971 | Surty | 219/85 D |
| 3,589,591 | 6/1971 | Schwenn | 228/44.1 A |
| 3,617,682 | 11/1971 | Hall | 228/4.5 |
| 3,628,717 | 12/1971 | Lynch | 228/44.1 A |
| 3,680,196 | 8/1972 | Leinkram | 228/232 |
| 3,680,762 | 8/1972 | Kondo | 228/36 |
| 3,941,297 | 3/1976 | Burns et al. | 228/4.5 |
| 3,991,297 | 11/1976 | Ammann | 219/85 D |
| 4,301,958 | 11/1981 | Hatakenaka et al. | 228/4.5 |
| 4,351,468 | 9/1982 | Floury et al. | 228/4.5 |

Primary Examiner—Kenneth J. Ramsey
Assistant Examiner—Kurt Rowan
Attorney, Agent, or Firm—Anthony J. Sarli, Jr.; Jeffrey Van Myers; Robert L. King

[57] ABSTRACT

A semiconductor die surface heater and a method of using the die surface heater as a wire bonding assembly are provided. In the preferred form, the semiconductor die surface heater comprises two heaters. A preheater heats the surface of a semiconductor die which is attached to a lead frame via radiant energy. A clamp which positions both the semiconductor die and lead frame during the wire bonding has a window portion with a surface clamp heater for heating at least the portion of the clamp around the window.

11 Claims, 3 Drawing Figures

METHOD OF WIRE BONDING A SEMICONDUCTOR DIE AND APPARATUS THEREFOR

TECHNICAL FIELD

This invention relates generally to wire bonding semiconductor devices and, more particularly, to a method of wire bonding a semiconductor and to apparatus therefor having heaters for heating the bonding surface of the semiconductor die.

BACKGROUND ART

When a semiconductor device is fabricated, a semiconductor die is typically wire bonded to a metal lead frame. In a conventional wire bonding assembly, a plurality of connected lead frames, each having a semiconductor die attached thereto, is inserted along a track. Each lead frame is passed under a hold down clamp which maintains the lead frame within a window which is cut through the clamp. After the lead frame is clamped, the semiconductor die is wire bonded to the lead frame. Typically, gold wire is used and the lead frame is a metal such as a nickel-iron alloy or copper. Due to a variety of factors, such as the presence of impurities on bonding pads, some wires do not stick to the bonding pads. In order to further enhance the strength of the wire bond, the semiconductor die is typically heated from below the lead frame. A disadvantage with heating the semiconductor die from beneath the lead frame is that the die is generally too thick for enough heat to reach the bonding surface to improve the strength of the wire bond. When inadequate heat occurs, more wire bonding failures occur. In conventional die bonding assemblies, others have used hot gas chambers. However, gas chamber heating is inefficient and difficult to control when used with high speed bonding and ceramic capillary gas tubes.

SUMMARY OF THE INVENTION

Accordingly, an object of the present invention is to provide an improved semiconductor wire bonding method and assembly therefor.

Another object of the invention is to provide an improved semiconductor die heater for use in a wire bonding assembly.

Yet another object of the invention is to provide an improved method and wire bonding assembly resulting in stronger wire bonds and improved wire bonding yields.

In carrying out the above and other objects of the present invention, there is provided, in one form, a wire bonding assembly in which a plurality of attached lead frames may be inserted into and moved along a track. Each lead frame has a semiconductor die attached to the center or flag of the frame. A hold down clamp extends over the track and has a window portion which may be raised and lowered and positioned around both the semiconductor die and lead frame during a wire bonding operation. Clamp heating means are positioned around the surface of the semiconductor die to heat the surface of the die via radiant energy. Preheating means are also positioned adjacent the clamp for heating said semiconductor die immediately prior to the wire bonding operation.

An improved method of wire bonding a semiconductor die to a lead frame is provided comprising the steps of surface preheating a semiconductor die which is attached to a lead frame. The semiconductor die is advanced to a hold down clamp position and then clamped. After being clamped, the semiconductor die is heated again from the surface while being wire bonded to the lead frame.

The above and other objects, features and advantages of the present invention will be more clearly understood from the following detailed description taken in conjunction with the accompanying drawings.

DETAILED DESCRIPTION OF THE PREFERRED EMBODIMENT

Figure 1:
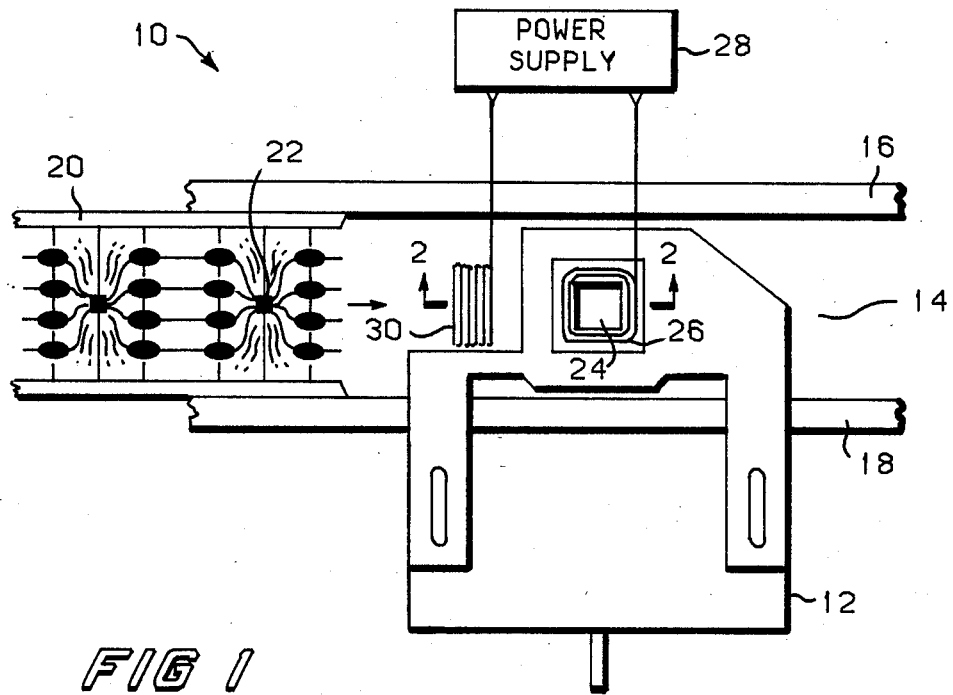
FIG. 1 illustrates a top plan view of a wire bonding assembly constructed in accordance with the preferred embodiment of the present invention.

Shown in FIG. 1 is a wire bonding assembly 10 comprising a hold down clamp 12 which is positioned over a lead frame track 14 having rails 16 and 18. A plurality of attached lead frames 20 of arbitrary design and shape may be inserted into track 14 and moved from left to right of FIG. 1. Positioned on top of each lead frame is a semiconductor die such as semiconductor die 22. Clamp 12 has a window portion 24 which is centrally positioned between rails 16 and 18. In a preferred form, window portion 24 is formed with each side thereof inclined to the top surface of clamp 12. A clamp heater 26 is coiled around window portion 24 and connected to a power supply 28. In a preferred form, clamp heater 26 is a rigid two-conductor metal braid wire. A preheater 30 is positioned adjacent the window portion 24 of clamp 12. Preheater 30 is substantially centered between rails 16 and 18 and is positioned above a semiconductor die and lead frame (not shown) immediately prior to being clamped by clamp 12 and the wire bonding operation. In a preferred form, preheater 30 is also a rigid two-conductor metal braid wire. A clamp holder 32 keeps preheater 30 suspended between rails 16 and 18 and above the moving attached lead frames 20. Preheater 30 is connected to power supply 28.

Figure 2:
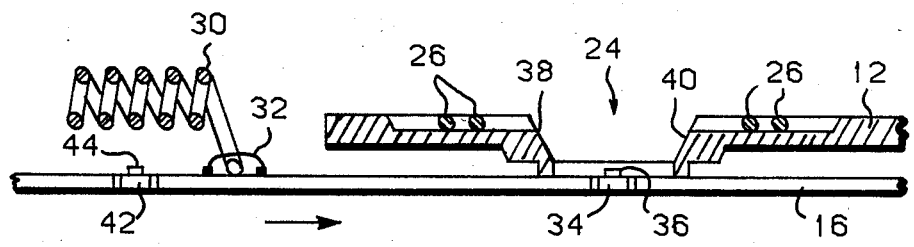
FIG. 2 illustrates a cross sectional view of a portion of the wire bonding assembly of FIG. 1 taken substantially on line 2—2 of FIG. 1.

Shown in FIG. 2 is a cross section of wire bonding assembly 10 taken substantially along line 2—2. In the view shown, a lead frame 34 is positioned below window 24. A semiconductor die 36 is attached to lead frame 34 in a conventional manner, such as by an adhesive, solder or the like. Clamp heater 26 is positioned around window portion 24 which, in the preferred form, has inclined sides 38 and 40. Preheater 30 is suspended over and above a lead frame 42 and a semiconductor die 44. Although, for purposes of simplicity, heater 26 is shown as comprising only two loops of wire, it will be well understood that more loops of wire may be placed adjacent window portion 24. Similarly, preheater 30 has been shown as comprising five loops of wire for purposes of simplicity of illustration. It will be well understood that either fewer or more loops of wire may be used.

In operation, referring to FIG. 2, lead frame 34 and semiconductor die 36 are inserted along rail 16 on the left and positioned temporarily under preheater 30. When power supply 28 is turned on, the coils of preheater 30 are constantly radiating energy. The radiant heat is absorbed at the surface of the semiconductor die and is also conducted through the lead frame. After a predetermined amount of time as discussed infra, lead frame 34 and semiconductor die 36 are moved to the right along rail 16 and positioned under hold down clamp 12. Hold down clamp 12 is lowered to firmly pin down lead frame 34 and semiconductor die 36 onto track 14 (shown in FIG. 1). When power supply 28 (FIG. 1) is turned on, heat is radiated by the wires forming clamp heater 26 to hold down clamp 12 and around window portion 24. The heat is radiated from hold down clamp 12 to both lead frame 34 and semiconductor die 36. While lead frame 34 and semiconductor die 36 are clamped, metal wires (not shown) extending from semiconductor die 36 are bonded to lead frame 34 by a machine (not shown) which extends from above clamp 12 down through window portion 24. In a preferred form, the machine is typically a thermosonic wire bonder, but the present invention may be practised with other types of bonding machines. During the wire bonding process, lead frame 42 and semiconductor die 44 are preheated by preheater 30. After the wires of semiconductor 36 have been bonded, clamp 12 is raised and lead frames 34 and 42 are moved along rail 16 so that lead frame 42 and semiconductor die 44 are now centrally positioned in window portion 24. The wire bonding method is then repeated and a continuous wire bonding assembly is achieved.

Figure 3:
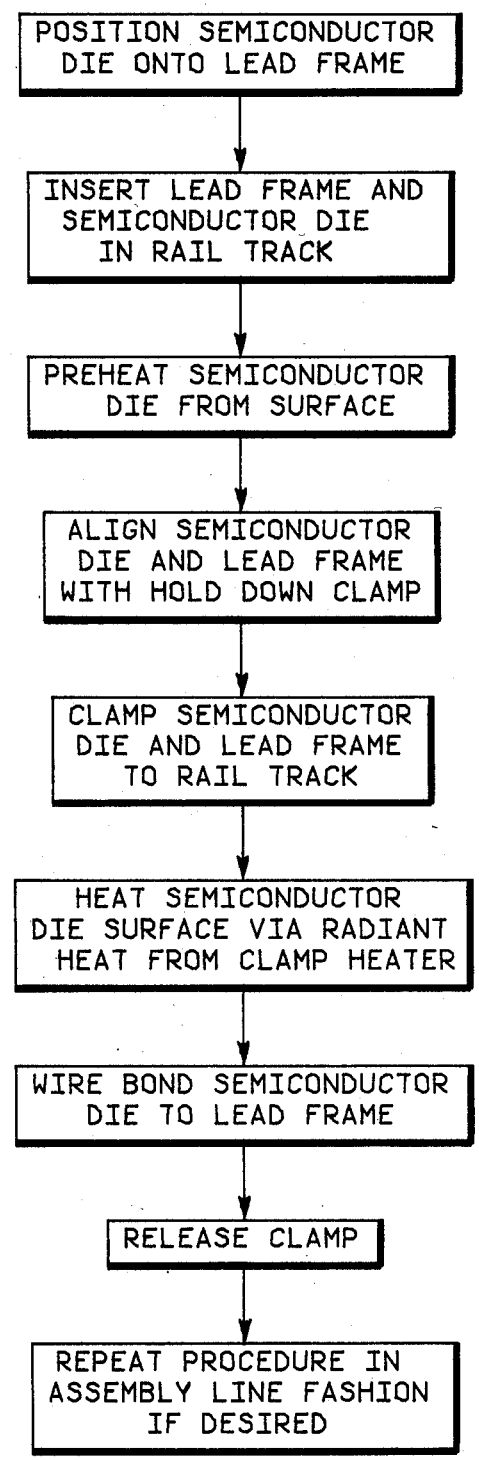
FIG. 3 illustrates in block diagram form a method of wire bonding a semiconductor die to a lead frame in accordance with the preferred embodiment of the present invention.

Referring to FIG. 3, the steps of the method of wire bonding according to the preferred form of the invention are outlined. It will be apparent from the method that a lead frame of any size may be used and that various semiconductor dies may also be used. The length of time a semiconductor die is allowed to remain under preheater 30 is determined primarily by the amount of time required to wire bond the immediately preceding semiconductor die. A typical length of time required for conventional wire bonding machinery to bond fourteen to sixteen leads is five to seven seconds. Therefore a standard sixteen lead frame integrated circuit would take approximately ten seconds to align and wire bond. Generally, no time is dedicated to specifically heat the semiconductor die via radiant clamp heat after the lead frame has been clamped prior to wire bonding. Although in a preferred form both preheater 30 and clamp heater 26 are utilized, the present invention may be practised by only using clamp heater 24. However, when preheater 30 is used, the function of clamp heater 26 is primarily to maintain or slightly raise the semiconductor die heat during wire bonding. The method outlined in FIG. 3 may be embodied as an assembly line manufacture of semiconductor devices or as a method to aperiodically wire bond semiconductor dies to lead frames.

Test results using the present invention note substantial improvements in yield when both preheater 30 and clamp heater 26 are used. Also, by heating the semiconductor die from the surface via radiant heat energy, superior bonding results are achieved. Typically, it is impossible to positively identify the cause or causes of wire bonding failures. Sources of bonding problems include the presence of oxide on bonding pads, the age of the semiconductor die and the thickness of the bonding pad. Therefore, the same semiconductor device may have excellent or poor yields depending upon variations in raw materials used. In all semiconductor devices tested using both a preheater and a clamp heater, improvement in yield was noted. In other words, there were fewer parts having one or more die wires lift from the lead frame when the preheater and clamp heater were used. During testing, a power supply voltage was used which provided a surface preheater coil temperature sufficient to heat the semiconductor die surface temperature from between 200 degrees Celsius to 250 degrees Celsius. Simultaneously, a power supply voltage was used which provided a clamp heater surface temperature sufficient to raise the semiconductor die surface temperature to approximately 240 degrees Celsius when the lead frame and semiconductor die are clamped into the bonding position. When a semiconductor die surface temperature of approximately 240 degrees Celsius is maintained around heater clamp 12, the temperature of heater clamp 12 itself was substantially 200 degrees Celsius. Test results positively showed that, on the whole, for any type of semiconductor, preheating a semiconductor die from the surface improves the wire bondability of the bonding pad. Although the amount of increase in yield varied with bondability conditions of the bonding pad, an improvement in yield was always noted by preheating the semiconductor die from the surface.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A semiconductor die surface heater in combination with a wire bonding assembly having a hold down clamp used for positioning a lead frame having a semiconductor die attached thereto with the die positioned within a window through said clamp prior to wire bonding said semiconductor die to a bonding surface of said lead frame, comprising:

a surface heater positioned around said window and above the lead frame for raising the temperature of said bonding surface.

2. The semiconductor die surface heater of claim 1 further comprising:

a surface pre-heater positioned substantially adjacent said window and above said lead frame, for preheating the bonding surface of said semiconductor die immediately prior to heating said bonding surface with said surface heater.

3. The semiconductor die surface heater of claims 1 or 2 wherein said surface heater is a coil heater.

4. The semiconductor die surface heater of claim 2 wherein said surface pre-heater is a coil heater.

5. A wire bonding assembly comprising:

a hold down clamp for maintaining a lead frame having a semiconductor die attached thereto with the die positioned within a window through said clamp during a wire bonding operation;

means for performing a wire bonding operation through said window; and clamp heating means positioned above the lead frame, for heating at least the portion of said clamp around said window, whereby said semiconductor die is heated via radiant heat energy.

6. The wire bonding assembly of claim 5 further comprising:

preheating means positioned adjacent said clamp and above the lead frame for heating said semiconductor die immediately prior to said wire bonding operation.

7. A method of wire bonding a semiconductor die to a lead frame comprising the steps of:

positioning a lead frame having said semiconductor die mounted thereon within a window of a hold down clamp;

clamping the lead frame below said hold down clamp for maintaining a bonding surface of the lead frame within said window;

positioning a surface heater around said window and above the lead frame;

heating at least the portion of said clamp around said window via radiant heat energy from the surface heater prior to bonding said semiconductor die to said lead frame; and wire bonding said semiconductor die to said lead frame.

8. The method of claim 7 further comprising:

preheating said semiconductor die immediately prior to said wire bonding via radiant heat energy originating from above the lead frame.

9. A wire bonding assembly comprising:

a hold down clamp for maintaining a lead frame having a semiconductor die attached thereto with the die positioned within a window through said clamp during a wire bonding operation;

clamp heating means positioned above the lead frame for heating at least the portion of said clamp around said window;

means for performing a wire bonding operation through said window; and preheating means positioned adjacent said clamp for heating a surface of said semiconductor die immediately prior to said wire bonding operation.

10. A method of wire bonding a semiconductor die to a lead frame comprising:

preheating said semiconductor die which is to be wire bonded immediately prior to said die being advanced to a wire bonding position;

advancing said die and clamping said die in said position with a hold down clamp;

heating said clamp by heating means positioned above the lead frame to increase the temperature of said die, thereby enhancing the strength of the wire bond; and wire bonding said die to said lead frame.

11. The method of claim 10 wherein the die temperature is increased sufficiently to enhance the strength of the wire bond without causing said semiconductor to lift from said lead frame.

* * * * *